US008936968B2

(12) United States Patent
Horng

(10) Patent No.: US 8,936,968 B2
(45) Date of Patent: Jan. 20, 2015

(54) FLIP CHIP PACKAGE MANUFACTURING METHOD

(75) Inventor: Horng Chih Horng, Hsinchu (TW)

(73) Assignee: Ableprint Technology Co., Ltd., Hsinchu (TW)

(*) Notice: Subject to any disclaimer, the term of this patent is extended or adjusted under 35 U.S.C. 154(b) by 386 days.

(21) Appl. No.: 13/534,073

(22) Filed: Jun. 27, 2012

(65) Prior Publication Data

US 2013/0065362 A1  Mar. 14, 2013

(30) Foreign Application Priority Data

Sep. 14, 2011 (TW) ............................. 100133026 A

(51) Int. Cl.
| H01L 21/00 | (2006.01) |
| H01L 21/44 | (2006.01) |
| H01L 21/78 | (2006.01) |
| H01L 23/00 | (2006.01) |
| H01L 21/683 | (2006.01) |

(52) U.S. Cl.
CPC ............... *H01L 21/78* (2013.01); *H01L 24/81* (2013.01); *H01L 24/83* (2013.01); *H01L 24/27* (2013.01); *H01L 21/6836* (2013.01); *H01L 2224/16225* (2013.01); *H01L 2224/32225* (2013.01); *H01L 2224/73204* (2013.01); *H01L 2224/83101* (2013.01); *H01L 2924/01322* (2013.01); *H01L 2224/81193* (2013.01); *H01L 2224/83948* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/27436* (2013.01); *H01L 2224/2919* (2013.01); *H01L 2224/81203* (2013.01); *H01L 2224/81204* (2013.01); *H01L 2224/81801* (2013.01); *H01L 2224/81908* (2013.01); *H01L 2224/83191* (2013.01); *H01L 2224/83908* (2013.01); *H01L 2924/3641* (2013.01); *H01L 2221/68327* (2013.01); *H01L 2221/6834* (2013.01); *H01L 2221/68377* (2013.01)
USPC ........................... 438/108; 438/464; 438/612

(58) Field of Classification Search
USPC ......................................... 438/108, 464, 612
See application file for complete search history.

(56) References Cited

U.S. PATENT DOCUMENTS

| 5,975,408 | A * | 11/1999 | Goossen ..................... 228/173.2 |
| 6,168,972 | B1 * | 1/2001 | Wang et al. .................. 438/108 |
| 6,400,034 | B1 * | 6/2002 | Kimura et al. ................ 257/778 |
| 6,555,414 | B1 * | 4/2003 | Vanfleteren et al. .......... 438/108 |

(Continued)

FOREIGN PATENT DOCUMENTS

JP    2002-118147    *   4/2002

*Primary Examiner* — James Mitchell
(74) *Attorney, Agent, or Firm* — Rosenberg, Klein & Lee

(57) ABSTRACT

A flip chip package manufacturing method is provided. A non-conductive film is pressed onto a wafer with multiple conductive bumps. The wafer is cut to multiple single chips. A carrier is provided, and a thermo-compression flip chip bonding process is executed to bond the non-conductive film onto the carrier. The carrier is transferred into a chamber with enclosed, pneumatic pressurized and heatingable characteristics to execute a de-void process to eliminate the bubbles and to execute a high-temperature soldering process to solder the single chip onto the carrier. The sequence of the de-void process and the high-temperature soldering process may exchange.

28 Claims, 9 Drawing Sheets

(56) References Cited

U.S. PATENT DOCUMENTS 7,074,703 B2 * 7/2006 Fukazawa .................... 438/598
2010/0190293 A1 * 7/2010 Maeda et al. ................ 438/108
2012/0032328 A1 * 2/2012 Lin et al. ...................... 257/738

* cited by examiner

FLIP CHIP PACKAGE MANUFACTURING METHOD

BACKGROUND OF THE INVENTION

1. Field of the Invention

The present invention relates to a flip chip package manufacturing method. More particularly, the present invention relates to a flip chip package manufacturing method with the combination of a liquid under-filling resin curing process and a thermo-compression flip chip bonding process.

2. The Related Arts

With the advanced technology, all kinds of electronic components inside the electrical devices advance the function such as the operation speed, the integration, the complexity and etc. Meanwhile, as the electronic mobile devices become thinner, lighter and smaller, the sizes of the electronic components and chips also become getting smaller.

Prior flip chip technology using conductive bumps instead of wiring for electrical signal connection is widely known in the chip packaging field, as referred to C4 process. Please referring to FIG. 1A, FIG. 1A is a schematic of C4 flip chip packaging. Pre-solder 102 is covered on each predetermined bond pad 101 of the carrier 10, and the semiconductor chip 1 is flipped to bond onto the carrier 10 for package, such that each conductive bump 11 of the semiconductor chip 1 is electrically connected to the carrier 10 via bonding the conductive bump 11. The overall thickness and the signal transmission path of the package can be reduced due to the electrical connection without wire, thus the method can meet the package trends of light, thin, short and small and is widely used in the chip packaging field.

FIG. 1B is a flow chart of the prior C4 process for chip packaging. The prior C4 process including steps of: providing a wafer in step S101; attaching a grinding adhesive layer onto the upper surface of the wafer in step S102; thinning and grinding the under surface of the wafer in step S103; removing the grinding adhesive layer in step S104; providing a carrier in step S105; cutting the wafer to multiple chips in step S106; flipping chip and bonding to carrier in step S107; reflowing in step S108; filling liquid resin in step S109; curing the liquid resin in step S110; and inspecting the finished product in step S111.

The liquid resin filling process in step S109 of FIG. 1B is to use the resin to fill and seal the gap H between the chip 1 and the carrier 10. The thermal expansion coefficient of the semiconductor chip 1 is about 3~5 ppm/° C., and the thermal expansion coefficient of the carrier 10 is about 20~30 ppm/° C. Due to the mismatch of the thermal expansion coefficients is very large, the temperature variation during the package process may cause the stress generated from coefficient thermal expansion difference and damage bonded solder joint. Filling the resin can effectively reduce the stress and therefore enhance the reliability of the package structure and stabilize the product quality. The prior liquid resin filling method mainly uses a dispensing robot dispenser (DRD) to dispense the liquid resin material onto the edge of the chip 1, and the resin material will flow to the bottom of the chip 1 by capillarity to fill the gap H between the chip 1 and the carrier 10.

However, the pitch of the conductive bump and the bond pad becomes smaller which reduces the bonded gap between the flipped chip and the carrier; such that it needs to take more time to fill the space below the chip due to the small flow capillarity phenomena of the resin material. The increasing difficulty of filling the space below the chip leads the existence of the bubbles inside the resin material.

Besides, during the manufacturing process of the multi-chip module (MCM) and multi-chip stack package, the flip chip process is executed for many times. After the reflow high-temperature heating process for many times, the conductive bump of the chip will often be oxidized. It will reduce the adhesion between the filled resin material and conductive bumps. Besides, due to the bonded solder stress generated from the thermal expansion coefficient difference during the heating process for many times, it will degrade the reliability of the mechanical and electrical characteristics of the soldering joint.

Thus, the non-conductive film (NCF) is provided to replace the liquid resin materials, and the thermo-compression flip chip bonding process will executed with the high bonding accuracy, high-temperature and compression method to solve the above problems, wherein the non-conductive film (NCF) is multi-stage hot-cured type and has low modulus in high temperature.

Please referring to FIG. 2A, FIG. 2A is a flow chart of the prior flip chip method with the non-conductive film. As shown in, firstly, a wafer is provided in step S201, and the wafer has multiple conductive bumps on the upper surface of the wafer, wherein the material of the conductive bumps may comprise at least one of tin, silver, copper, gold, indium, lead, bismuth and zinc. The non-conductive film is laminated onto the upper surface of the wafer in step S202, a thinning grinding process is executed to thin and grind the under surface of the wafer in step S203, and then the wafer is cut to multiple single chips in step S204. Then, a carrier is provided in step S205, and a thermo-compression flip chip bonding process is executed to bond the single chip attached with the non-conductive film to the carrier in step S206, wherein the temperature is raised up and the non-conductive film on the single chip is pressed onto the carrier such that the conductive bumps of the single chips pierce through the non-conductive film to make the conductive bump contact with the bond pad of the carrier. Then, a high-temperature compression soldering process is executed with raising temperature rapidly in step S207 to melt the conductive bump to directly solder on the carrier. Finally, a curing process is executed to cure the liquid resin in step S208 and an inspection process is executed to inspect the finished product in step S209.

Please referring to FIG. 2B, FIG. 2B is a press-temperature time curve diagram of bonding process in prior art. As shown in, initially, as the temperature gradually increases to 140° C., the conductive bump of the chip is pressed to 20N to pierce through the non-conductive film, wherein the elastic coefficient of the non-conductive film decreases due to the increased temperature. Thus, the conductive bump contacts the predetermined bond pad of the carrier such to attach the non-conductive film onto the carrier. Then, after confirming the corresponding position of the conductive bump of the chip and the predetermined bond pad of the carrier, the press exerting on the chip is decreased to 1N, and simultaneously the temperature is raised rapidly to melt the conductive bump to even form the eutectic solder to directly solder the conductive bump onto the carrier. As shown in, when the temperature increases to 260° C., the whole flip chip soldering process is finished within several seconds. Executing the flip chip process via the non-conductive film does not require the liquid resin and the reflow process, thus it may effectively solve the bubble problem generated from resin filling process and lower reliability issue of the mechanical and electrical characteristics of the soldering joint in many times reflow heating process, and simplify the process steps of the chip package.

If the pitch among the conductive bumps of the chip is tiny, for example smaller than 100 um, and the surface flatness of the solder resist layer of the carrier is uneven, the bubbles gap will exist in the junctions while laminating the non-conductive film onto the surface of the chip, and pressing the non-conductive film onto the carrier. The wetting effect generated in high temperature may attach the non-conductive film effectively and seamlessly, but the temperature increases rapidly and shortly to lead the limitation of the wetting effect. Beside, the rapid increasing temperature leads the bubbles in the junction to expand to permeate into the non-conductive film having low elastic coefficient under high temperature. Thus, the bubbles may exist in the junction between the carrier and the non-conductive film, in the junction between the non-conductive film and the chip, and inside the non-conductive film. The existence of the bubbles in the junction or inside the film may cause the great risk of failure reliability for the device having the fine pitch of the conductive bumps.

Besides, comparing the prior liquid resin filling method for flip chip process, prior two-step thermo-compression flip chip process with the non-conductive film has higher equipment costs. The thermo-compression flip chip boning time is also about 2 to 3 times to the liquid resin filling method. Thus, for the industry, reducing the required investment cost for flip chip process with the non-conductive film has been emphasized.

SUMMARY OF THE INVENTION

FIG. 3 illustrates the bubbles inside the package, including the bubbles in the junction between the carrier and the non-conductive film attaching onto the carrier, the bubbles in the junction between the non-conductive film and the single chips, and the bubbles caused by heating the non-conductive film during the flip chip bonding process.

The present invention aims to provide a flip chip package manufacturing method to improve the junction bubble generated during the flip chip bonding process with the non-conductive film, the bubble inside the non-conductive film and the high investment cost issue.

In order to achieve the aforementioned object, a technical aspect of the present invention relates to a flip chip package manufacturing method comprising the following steps: (A) providing a wafer having a plurality of conductive bumps on an upper surface of the wafer; (B) laminating a non-conductive film onto the upper surface of the wafer; (C) executing a thinning grinding process to thin and grind an under surface of the wafer; (D) cutting the wafer to a plurality of single chips; (E) providing at least one carrier having a plurality of bond pads corresponding the position of the conductive bumps of the single chip, and executing a thermo-compression flip chip bonding process to attach the non-conductive film onto the carrier, such that the conductive bumps of the single chips pierce the non-conductive film on the conductive bumps and make contact with predetermined bond pads on the carrier; (F) transferring the carrier into a chamber having enclosed, pneumatic pressurized and heatingable characteristics, and executing a de-void process to eliminate the bubbles in the junction between the carrier and the non-conductive film attaching onto the carrier, the bubbles in the junction between the non-conductive film and the single chips, and the bubbles caused by heating the non-conductive film during the flip chip bonding process; (G) executing a high-temperature soldering process to solder at least one single chip onto the carrier; and (H) executing an inspection process.

In a preferred embodiment of the present invention, the high-temperature soldering process executed in step (G) is a high-temperature solder heating bonding process, such that the temperature of the chamber is raised continuously to a predetermined temperature to melt the conductive bumps to solder the single chips onto at least one carrier.

In a preferred embodiment of the present invention, the high-temperature soldering process executed in step (G) may be a conventional open ended reflow process type, such that the carrier is transferred into a reflow oven to execute the reflow process to melt the conductive bumps of the single chips to solder the predetermined bond pads of the carrier.

In order to achieve the aforementioned object, another technical aspect of the present invention relates to a flip chip package manufacturing method comprising the following steps: (A) providing a wafer having a plurality of conductive bumps on an upper surface of the wafer; (B) laminating a non-conductive film onto the upper surface of the wafer; (C) executing a thinning grinding process to thin and grind an under surface of the wafer; (D) cutting the wafer to a plurality of single chips; (E) providing at least one carrier having a plurality of bond pads corresponding the position of the conductive bumps of the single chip, and executing a thermo-compression flip chip bonding process to attach the non-conductive film onto the carrier, such that the conductive bumps of the single chips pierce the non-conductive film on the conductive bumps and make contact with predetermined bond pads on the carrier; (F) executing a high-temperature compression soldering process to solder at least one single chip onto the carrier; (G) transferring the carrier into a chamber having enclosed, pneumatic pressurized and heatingable characteristics, and executing a de-void process to eliminate the bubbles in the junction between the carrier and the non-conductive film, the bubbles in the junction between the non-conductive film and the single chips, and the bubbles caused by heating the non-conductive film during the flip chip bonding process; and (H) executing an inspection process.

In a preferred embodiment to achieve the aforementioned object with another technical aspect, the high-temperature compression soldering process may be executed by executing the above-mentioned thermo-compression flip chip bonding process.

BRIEF DESCRIPTION OF THE DRAWINGS

The following objectives, features, advantages and embodiments of the present invention can be more fully understood, with reference made to the accompanying drawings as follows.

DETAILED DESCRIPTION OF THE PREFERRED EMBODIMENTS

Figure 1A:
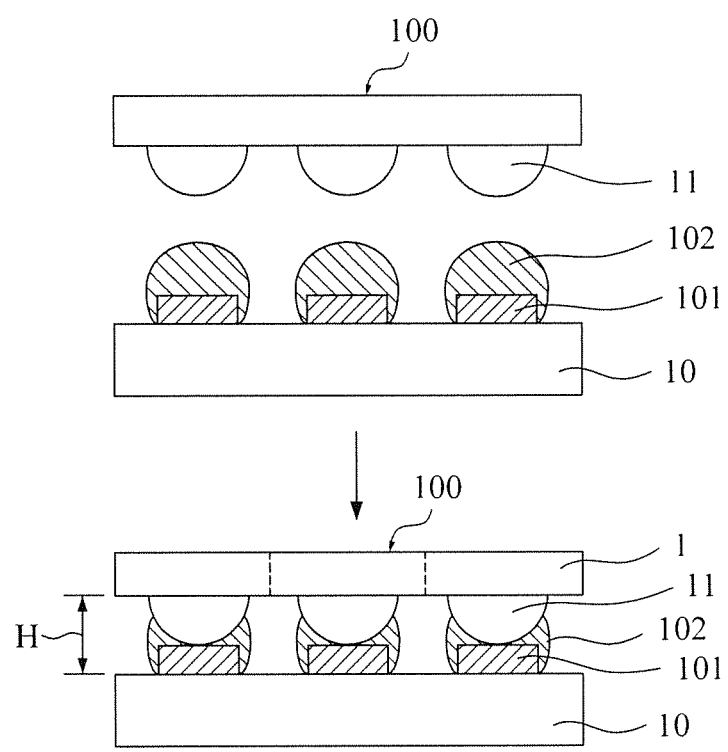
FIG. 1A is a schematic of a C4 process for chip packaging in prior art.
Figure 1B:
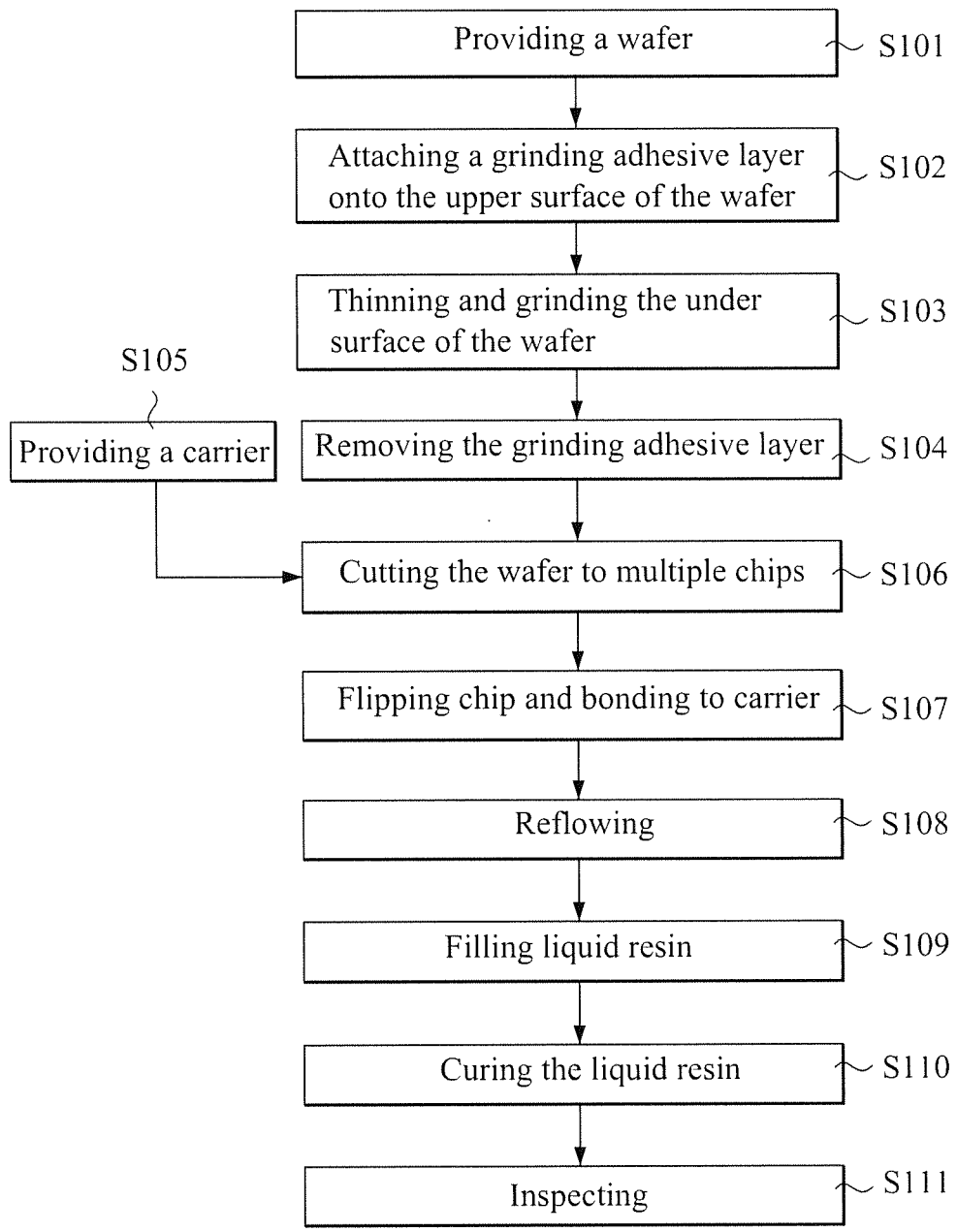
FIG. 1B is a flow chart of a C4 process for chip packaging in prior art.
Figure 2A:
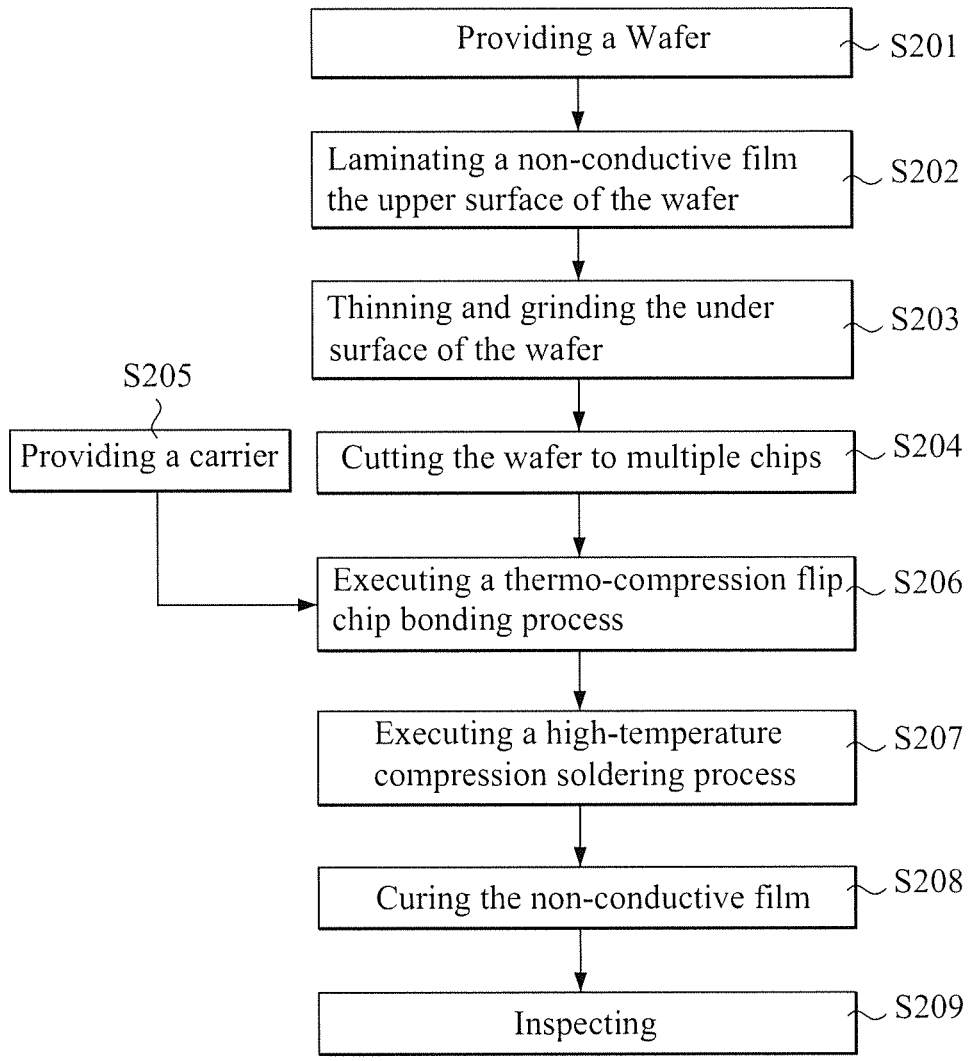
FIG. 2A is a flow chart of thermo-compression flip chip bonding process with the non-conductive film in prior art.
Figure 2B:
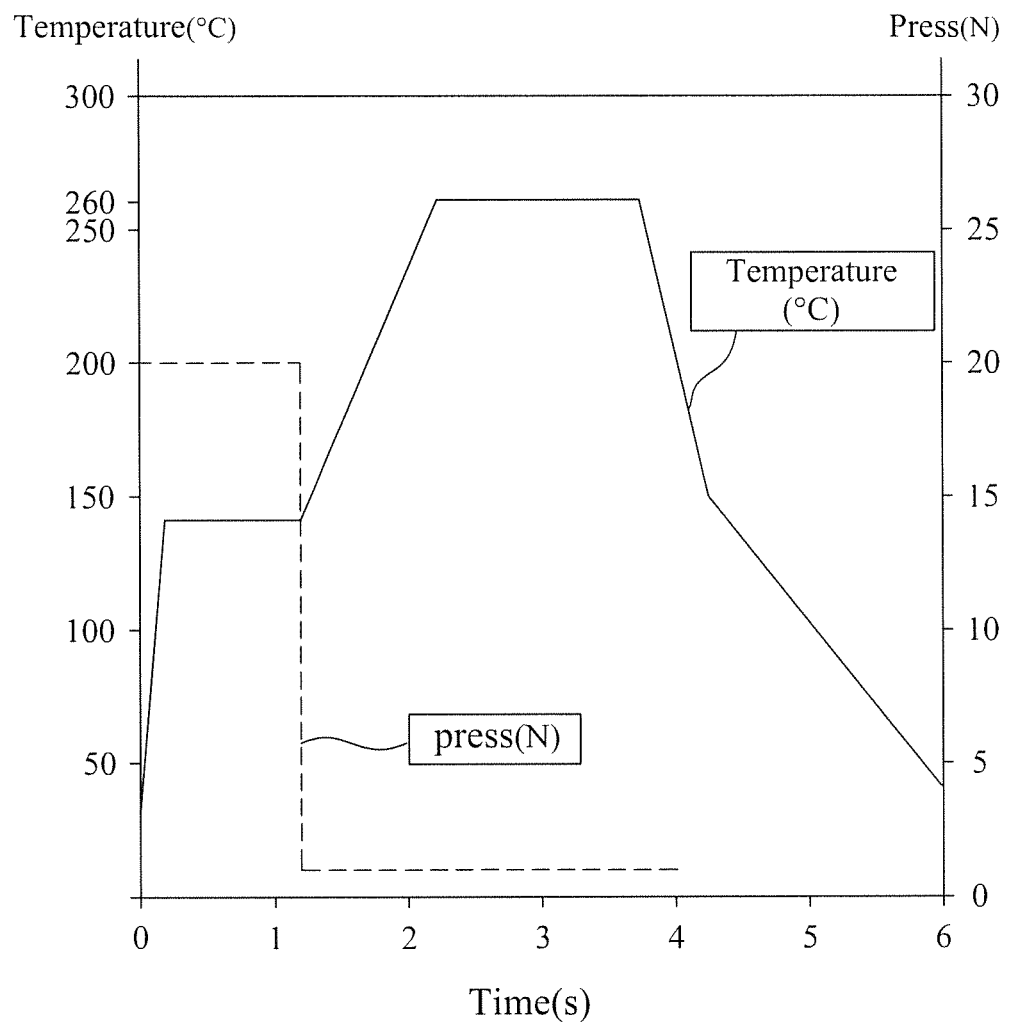
FIG. 2B is a press-temperature time curve diagram of thermo-compression flip chip bonding process using the flip chip bonder with the non-conductive film in prior art.
Figure 3:
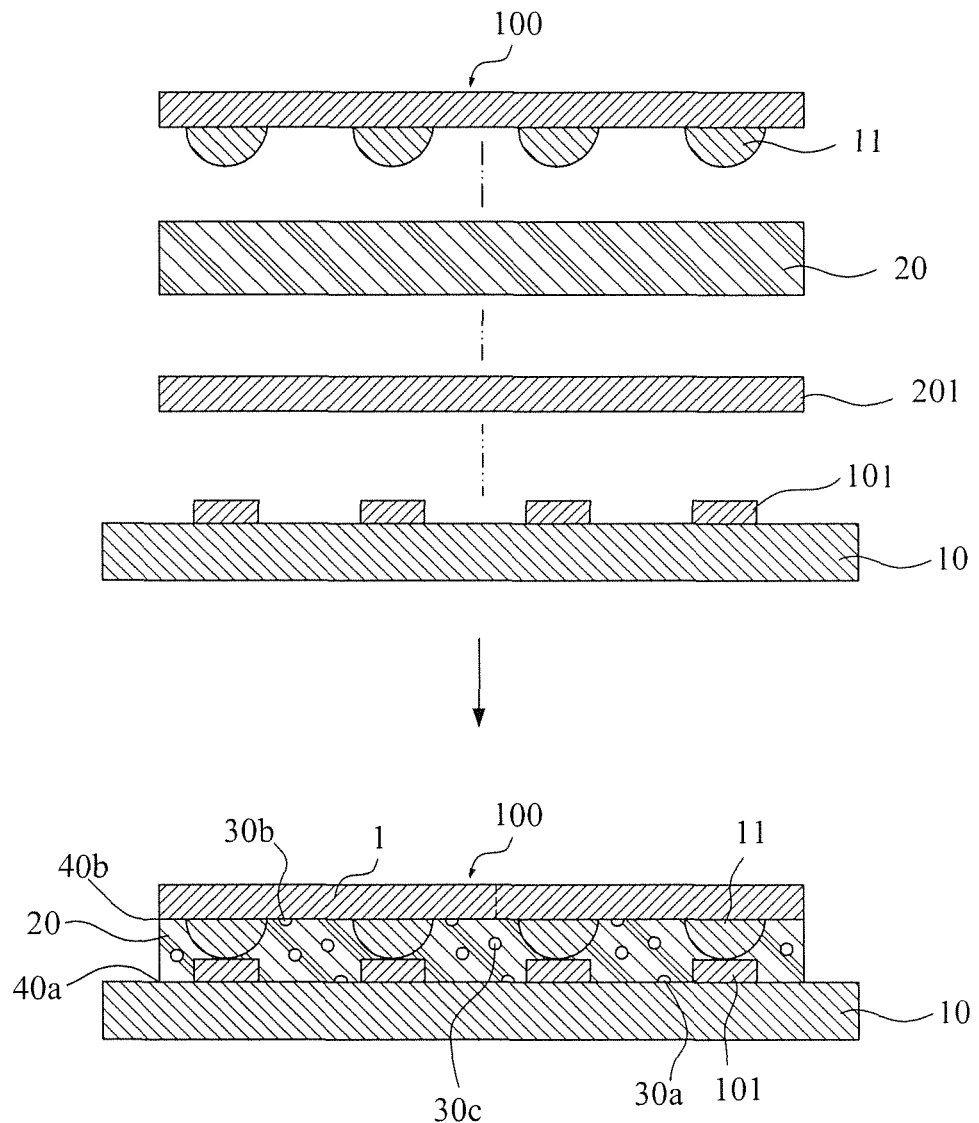
FIG. 3 is schematic of bubbles in junction between the carrier and the non-conductive film, in junction between the non-conductive film and the single chips, and inside the non-conductive film in accordance with the present invention.
Figure 4:
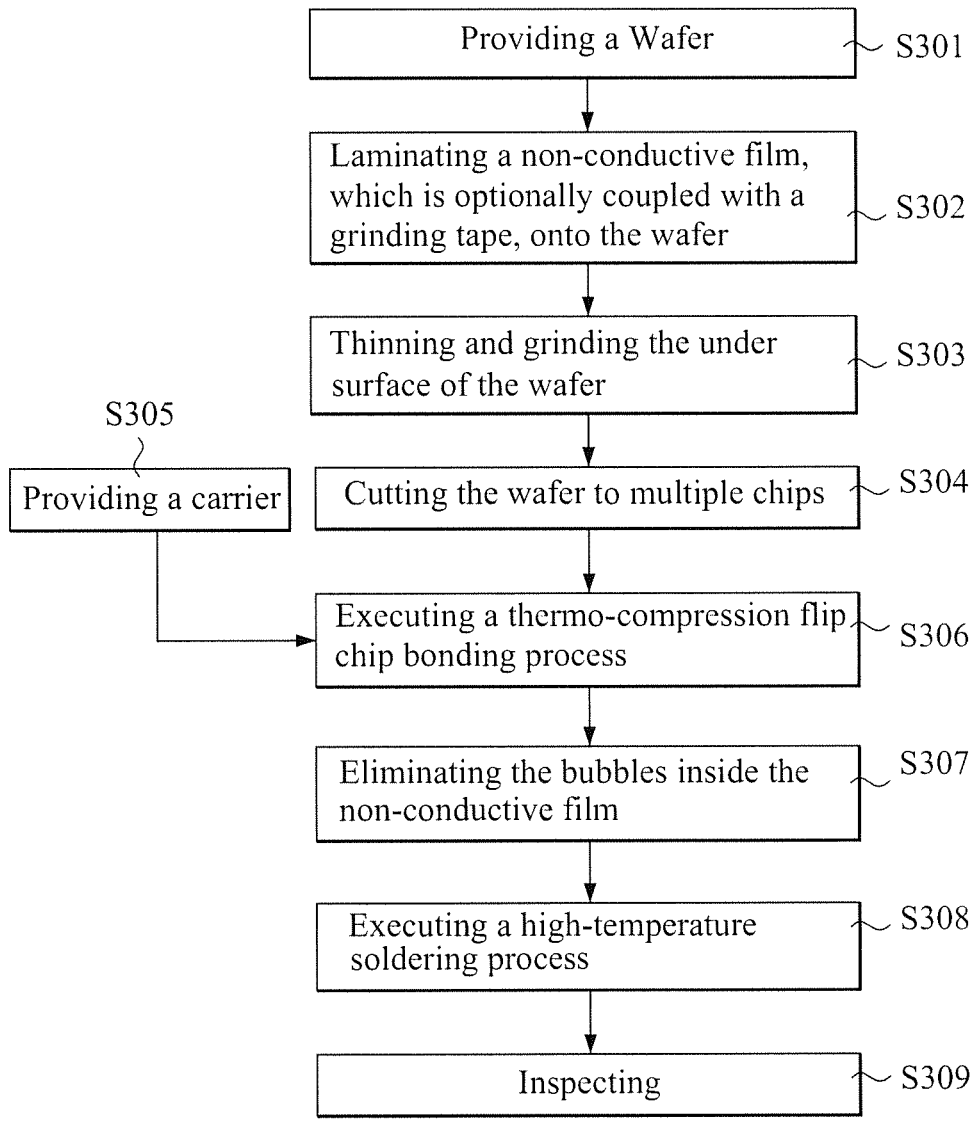
FIG. 4 is a flow chart of method according to a first embodiment of the present invention.

Referring to FIG. 3 and FIG. 4, FIG. 3 is schematic of bubbles in junction between the carrier and the non-conductive film, in junction between the non-conductive film and the single chips, and inside the non-conductive film in accordance with the present invention, and FIG. 4 is a flow chart of method according to a first embodiment of the present invention. As shown in s, a wafer 100 is firstly provided in step S301, and the wafer 100 has multiple conductive bumps 11 on the upper surface of the wafer 100, wherein the material of the conductive bumps 11 may preferably comprise at least one of tin, silver, copper, gold, indium, lead, bismuth and zinc. A non-conductive film 20 is laminated onto the upper surface of the wafer 100 in step S302, wherein the non-conductive film 20 is multi-stage hot-cured type. In step S302, the non-conductive film 20 may be selectably coupled with a grinding tape 201. A thinning grinding process is then executed to thin and grind the under surface of the wafer 100 in step S303, and the wafer 100 is cut to multiple single chips 1 in step S304. In case that the non-conductive film 20 is coupled with the grinding tape 201 in step 302, a further step of de-laminating the grinding tape 201 from the non-conductive film 20 is executed before step S304.

At least one carrier 10 with a number of bond pads 101 is provided in step S305, and a thermo-compression flip chip bonding process is executed to bond at least one carrier 10 with the single chips 1 attached with the non-conductive film 20 in step S306, wherein the temperature is raised, such that the conductive bumps 11 of the single chips 1 press onto and pierce through the non-conductive film 20 such to make contact with the predetermined bond pads 101 of the carrier 10 and make the non-conductive film 20 to attach onto the at least one carrier 10.

After confirming the corresponding position of the conductive bump 11 of the chip 1 and the predetermined bond pad 101 of the carrier 10, the carrier 10 is transferred into a chamber, wherein the chamber has enclosed, pneumatic pressurized and heatingable characteristics, and executes a de-void process to the carrier 10 to eliminate at least one first bubble 30a presented in the junction 40a between the carrier 10 and the non-conductive film 20, at least one second bubble 30b presented in the junction 40b between the non-conductive film 20 and the single chips 1, and at least one third bubble 30c inside the non-conductive film 20 caused by heating the non-conductive film 20 during the flip chip bonding process in step S307. Then, the chamber continuously raises the temperature to a predetermined temperature to melt the conductive bump 11 in the predetermined temperature to complete the conductive bumps soldering process in step S308. Finally, an inspection process in step S309 is executed to inspect the finished product.

After executing the de-void process in step S307 as shown in FIG. 4, the carrier may also be transferred to a reflow oven with a front open end and a rear open end to execute the high-temperature soldering process in step S308 with the reflow method.

In the flip chip package manufacturing method of the present invention, the flip chip bonder with thermo-compression is not used for conductive bump soldering process, thus the time and cost are lower comparing to the prior flip chip process with the non-conductive film. Beside, the de-void chamber can eliminate the bubbles inside the film and in the junction between the films. Thus, the method of the present invention can effectively improve the efficiency of flip chip packaging process, reduce manufacturing costs, reduce the bubbles in the flip chip package to improve product reliability, and simplify the manufacturing steps of the flip chip packaging process.

Figure 5:
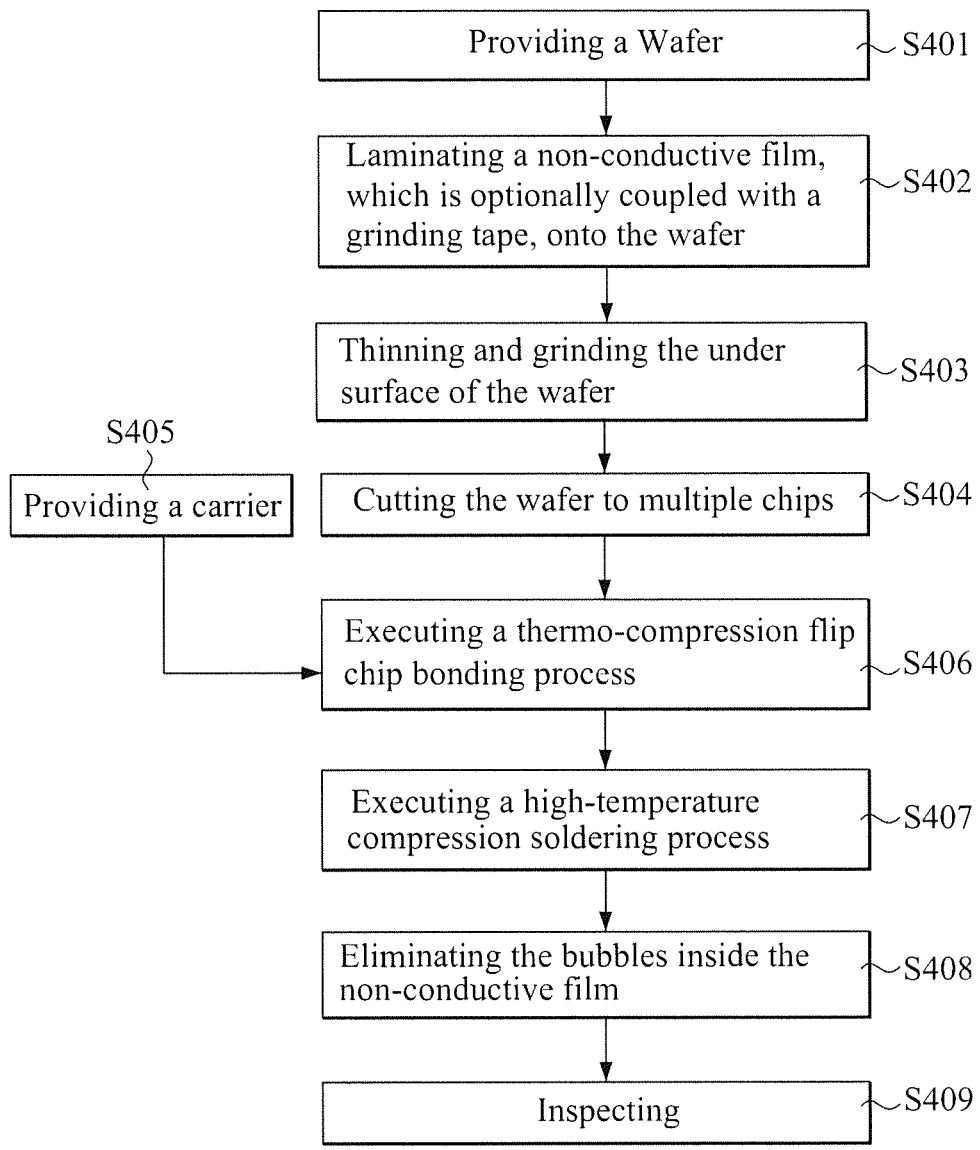
FIG. 5 is a flow chart of method according to a second embodiment of the present invention.

Another embodiment is provided in the present invention. Please referring to FIG. 5, FIG. 5 is a flow chart of method according to a second embodiment of the present invention. In this embodiment, a wafer is firstly provided in step S401. The non-conductive film is laminated onto the upper surface of the wafer, and is coupled with a grinding tape in step S402. A thinning grinding process is then executed to thin and grind the under surface of the wafer in step S403, and the wafer is cut to multiple single chips in step S404. In case that the non-conductive film is coupled with the grinding tape in step 402, a further step of de-laminating the grinding tape from the non-conductive film is executed before step S404. At least one carrier is provided in step S405, and a thermo-compression flip chip bonding process is executed in step S406, and then the temperature is raised, such that the conductive bumps of the single chips press onto and pierce through the non-conductive film such to bond onto the carrier. Then, the temperature is raised rapidly to directly melt and solder the conductive bump onto the carrier in step S407. Then, the carrier is transferred into a chamber with enclose, pneumatic pressurized and heatingable characteristics to execute a de-void process in step S408 to eliminate the bubbles in the junction between the carrier and the non-conductive film, the bubbles in the junction between the non-conductive film and the single chips, and the bubbles inside the non-conductive film caused by heating the non-conductive film during the flip chip bonding process. Finally, an inspection process in step S409 is executed to inspect the finished product.

In this embodiment, although the efficiency of enhancing the thermo-compression flip chip packaging process is limited, it is still effectively to eliminate the bubbles in the junction between the carrier and the non-conductive film, the bubbles in the junction between the non-conductive film and the single chips, and the bubbles inside the non-conductive film caused by heating the non-conductive film during the flip chip bonding process to improve the product reliability, wherein the pneumatic pressure should be set larger than 2 atm and the temperature should be set between 40° C.~400° C. in executing the process using the enclosed, pneumatic pressurized and heatingable chamber.

Figure 6:
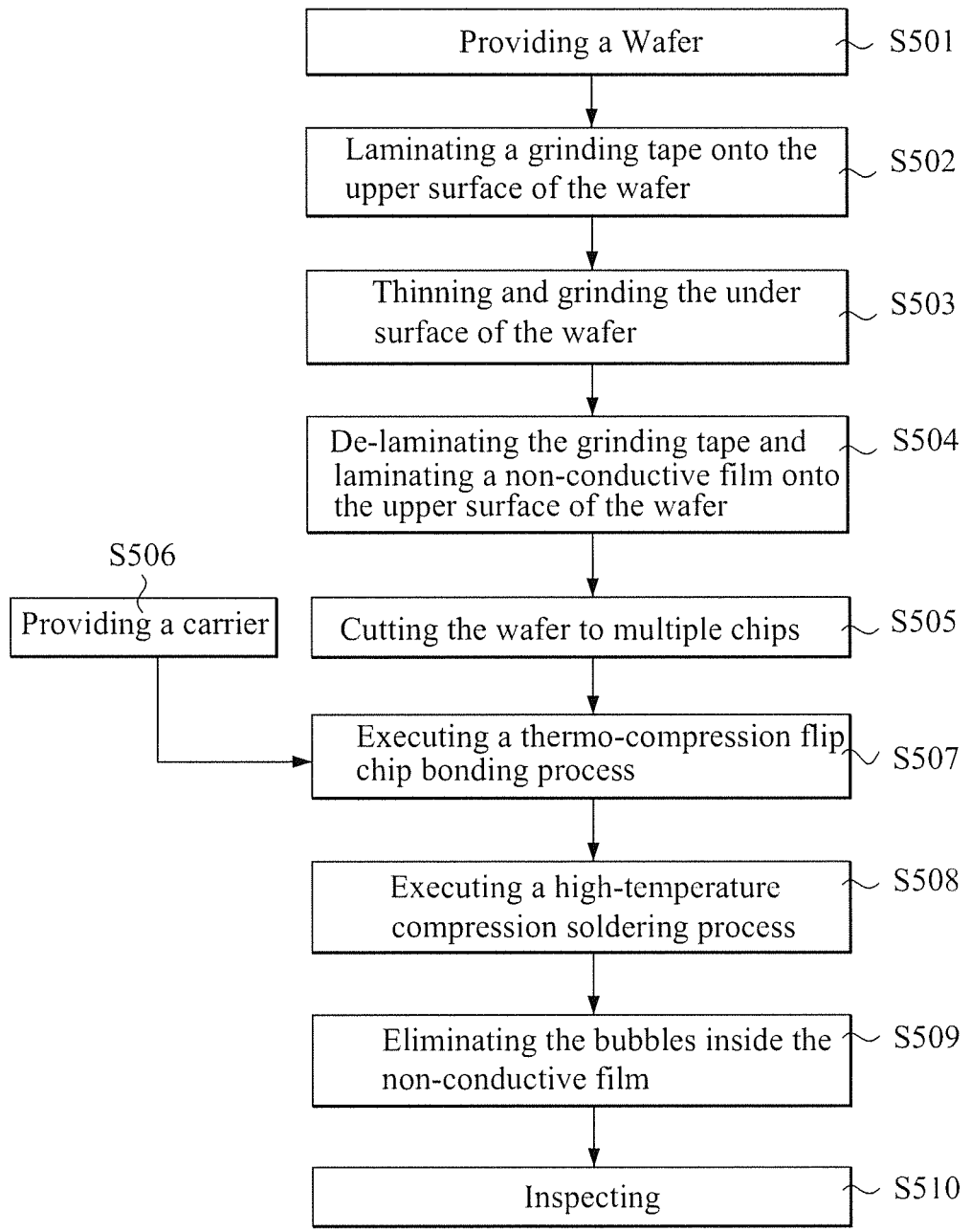
FIG. 6 is a flow chart of method according to a third embodiment of the present invention.

Please referring to FIG. 6, FIG. 6 is a flow chart of method according to a third embodiment of the present invention. In this embodiment, a wafer is firstly provided in step S501. A grinding tape is laminated onto the upper surface of the wafer in step S502. A thinning grinding process is then executed to thin and grind the under surface of the wafer in step S503. The grinding tape is then de-laminated, and a non-conductive film is laminated on the upper surface of the wafer in step S504. The wafer is cut to multiple single chips in step S505. At least one carrier is provided in step S506, and a thermo-compression flip chip bonding process is executed in step S507, and then the temperature is raised, such that the conductive bumps of the single chips press onto and pierce through the non-conductive film such to bond onto the carrier. Then, the temperature is raised rapidly to directly melt and solder the conductive bump onto the carrier in step S508. Then, the carrier is transferred into a chamber with enclose, pneumatic pressurized and heatingable characteristics to execute a de-void process in step S509 to eliminate the bubbles in the junction between the carrier and the non-conductive film, the bubbles in the junction between the non-conductive film and the single chips, and the bubbles inside the non-conductive film caused by heating the non-conductive film during the flip chip bonding process. Finally, an inspection process in step S510 is executed to inspect the finished product.

Figure 7:
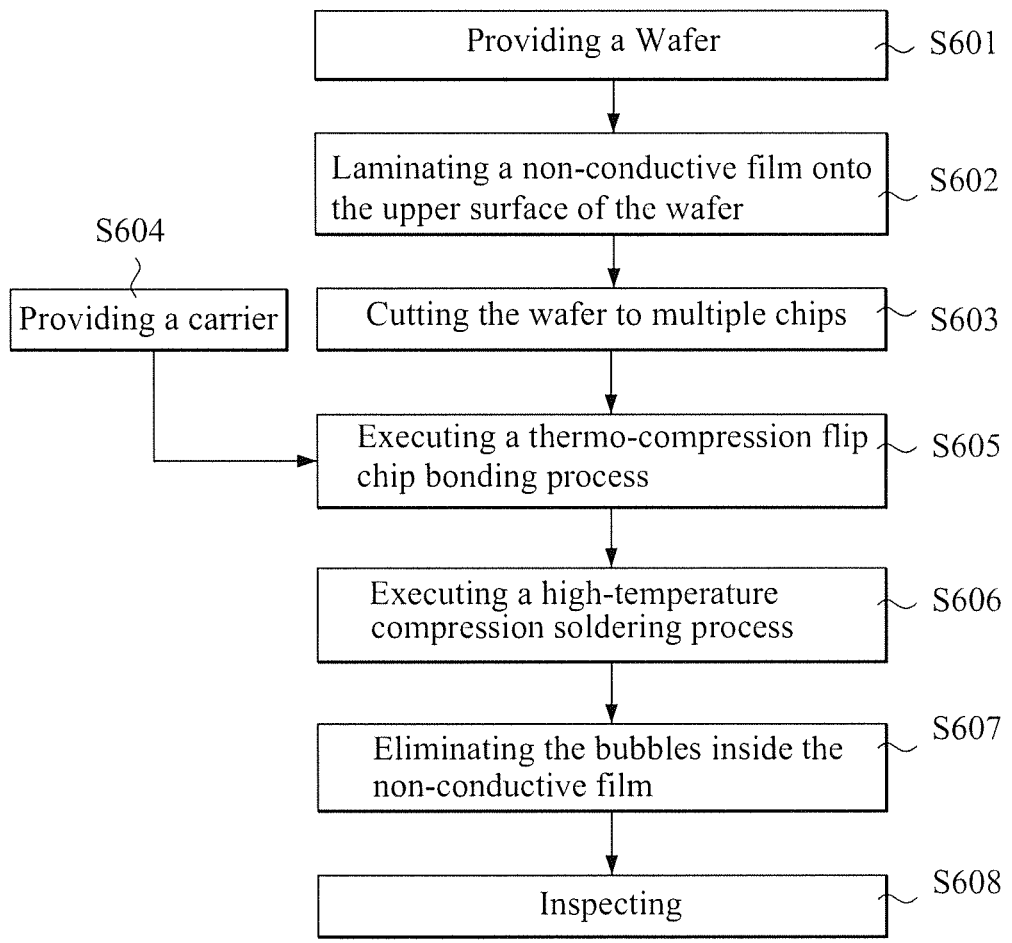
FIG. 7 is a flow chart of method according to a forth embodiment of the present invention.

Please referring to FIG. 7, FIG. 7 is a flow chart of method according to a forth embodiment of the present invention. In this embodiment, a wafer is firstly provided in step S601. The non-conductive film is laminated onto the upper surface of the wafer in step S602. The wafer is then cut to multiple single chips in step S603. At least one carrier is provided in step S604, and a thermo-compression flip chip bonding process is executed in step S605, and then the temperature is raised, such that the conductive bumps of the single chips press onto and pierce through the non-conductive film such to bond onto the carrier. Then, the temperature is raised rapidly to directly melt and solder the conductive bump onto the carrier in step S606. Then, the carrier is transferred into a chamber with enclose, pneumatic pressurized and heatingable characteristics to execute a de-void process in step S607 to eliminate the bubbles in the junction between the carrier and the non-conductive film, the bubbles in the junction between the non-conductive film and the single chips, and the bubbles inside the non-conductive film caused by heating the non-conductive film during the flip chip bonding process. Finally, an inspection process in step S608 is executed to inspect the finished product.

Although the present invention has been described with reference to the above embodiments, these embodiments are not intended to limit the present invention. It will be apparent to those skilled in the art that various modifications and variations can be made without departing from the scope or spirit of the present invention. Therefore, the scope of the present invention shall be defined by the appended claims.

What is claimed is:

1. A flip chip package manufacturing method, comprising:
   (A) providing a wafer having a plurality of conductive bumps on an upper surface of the wafer;
   (B) laminating a non-conductive film onto the upper surface of the wafer;
   (C) executing a thinning grinding process to thin and grind an under surface of the wafer;
   (D) cutting the wafer to a plurality of single chips;
   (E) providing at least one carrier having a plurality of bond pads corresponding the conductive bumps of the single chip, and executing a thermo-compression flip chip bonding process to attach the non-conductive film onto the carrier, such that the conductive bumps of the single chips pierce and press onto the non-conductive film on the conductive bumps to make contact with the predetermined bond pads on the carrier;
   (F) transferring the carrier into a chamber having enclosed, pneumatic pressurized and heatingable characteristics, and executing a de-void process to eliminate at least one first bubble in a first junction between the carrier and the non-conductive film, at least one second bubble in a second junction between the non-conductive film and the single chips, and at least one third bubble inside the non-conductive film caused by heating the non-conductive film during the thermo-compression flip chip bonding process;
   (G) executing a high-temperature soldering process in the chamber to solder at least one single chip onto the carrier; and
   (H) executing an inspection process.

2. The flip chip package manufacturing method of claim 1, wherein the conductive bumps comprise at least one material selected from the group consisting of tin, silver, copper, gold, indium, lead, bismuth and zinc.

3. The flip chip package manufacturing method of claim 1, wherein the carrier is one of print circuit board(PCB), substrate, chip, silicon interposer, and package.

4. The flip chip package manufacturing method of claim 1, wherein the non-conductive film in step (B) is coupled with a grinding tape.

5. The flip chip package manufacturing method of claim 1, wherein in the thermo-compression flip chip bonding process in step (E) is executed in a press and temperature setting such that the conductive bumps on the single chips pierce and press onto the non-conductive film, and make contact with the predetermined bond pads of the carrier.

6. The flip chip package manufacturing method of claim 1, wherein the chamber is set in a pneumatic pressure greater than 2 atm in step (F).

7. The flip chip package manufacturing method of claim 1, wherein the chamber is set in a temperature between 40° C.~400° C. in step (F).

8. The flip chip package manufacturing method of claim 1, wherein in step (G), the chamber is heated continuously to a predetermined temperature to melt the conductive bumps to solder the single chips onto the carrier.

9. The flip chip package manufacturing method of claim 1, wherein the high-temperature soldering process in step (G) comprises steps of transferring the carrier into a reflow oven to execute a reflowing process to melt the conductive bumps of the single chips to solder the predetermined bond pads of the carrier.

10. A flip chip package manufacturing method, comprising:
   (A) providing a wafer having a plurality of conductive bumps on an upper surface of the wafer;
   (B) laminating a non-conductive film onto the upper surface of the wafer;
   (C) executing a thinning grinding process to thin and grind an under surface of the wafer;
   (D) cutting the wafer to a plurality of single chips;
   (E) providing at least one carrier having a plurality of bond pads corresponding the conductive bumps of the single chip, and executing a thermo-compression flip chip bonding process to attach the non-conductive film onto the carrier, such that the conductive bumps of the single chips pierce and press onto the non-conductive film on the conductive bumps to make contact with the predetermined bond pads on the carrier;
   (F) executing a high-temperature compression soldering process to solder at least one single chip onto the carrier;
   (G) transferring the carrier into a chamber having enclosed, pneumatic pressurized and heatingable characteristics, and executing a de-void process to eliminate at least one first bubble in a first junction between the carrier and the non-conductive film, at least one second bubble in a second junction between the non-conductive film and the single chips, and at least one third bubble inside the non-conductive film caused by heating the non-conductive film during the thermo-compression flip chip bonding process; and
   (H) executing an inspection process.

11. The flip chip package manufacturing method of claim 10, wherein the conductive bumps comprise at least one material selected from the group consisting of tin, silver, copper, gold, indium, lead, bismuth and zinc.

12. The flip chip package manufacturing method of claim 10, wherein the carrier is one of print circuit board(PCB), substrate, chip, silicon interposer and package.

13. The flip chip package manufacturing method of claim 10, wherein the non-conductive film in step (B) is coupled with a grinding tape.

14. The flip chip package manufacturing method of claim 10, wherein in the thermo-compression flip chip bonding process in step (E), is executed in a press and temperature setting such that the conductive bumps on the single chips can pierce and press onto the non-conductive film, and make contact with the predetermined bond pads of the carrier.

15. The flip chip package manufacturing method of claim 10, wherein in the chamber is set in a pneumatic pressure greater than 2 atm in step (G).

16. The flip chip package manufacturing method of claim 10, wherein the chamber is set in a temperature between 40° C.~400° C. in step (G).

17. A flip chip package manufacturing method, comprising:
(A) providing a wafer having a plurality of conductive bumps on an upper surface of the wafer;
(B) laminating a grinding tape onto the upper surface of the wafer;
(C) executing a thinning grinding process to thin and grind an under surface of the wafer;
(D) de-laminating the grinding tape and laminating a non-conductive film onto the upper surface of the wafer;
(E) cutting the wafer to a plurality of single chips;
(F) providing at least one carrier having a plurality of bond pads corresponding the conductive bumps of the single chip, and executing a thermo-compression flip chip bonding process to attach the non-conductive film onto the carrier, such that the conductive bumps of the single chips pierce and press onto the non-conductive film on the conductive bumps to make contact with the predetermined bond pads on the carrier;
(G) executing a high-temperature compression soldering process to solder at least one single chip onto the carrier;
(H) transferring the carrier into a chamber having enclosed, pneumatic pressurized and heatingable characteristics, and executing a de-void process to eliminate at least one first bubble in a first junction between the carrier and the non-conductive film, at least one second bubble in a second junction between the non-conductive film and the single chips, and at least one third bubble inside the non-conductive film caused by heating the non-conductive film during the thermo-compression flip chip bonding process; and
(I) executing an inspection process.

18. The flip chip package manufacturing method of claim 17, wherein the conductive bumps comprise at least one material selected from the group consisting of tin, silver, copper, gold, indium, lead, bismuth and zinc.

19. The flip chip package manufacturing method of claim 17, wherein the carrier is one of print circuit board(PCB), substrate, chip, silicon interposer and package.

20. The flip chip package manufacturing method of claim 17, wherein in the thermo-compression flip chip bonding process in step (F), is executed in a press and temperature setting such that the conductive bumps on the single chips can pierce and press onto the non-conductive film, and make contact with the predetermined bond pads of the carrier.

21. The flip chip package manufacturing method of claim 17, wherein in the chamber is set in a pneumatic pressure greater than 2 atm in step (H).

22. The flip chip package manufacturing method of claim 17, wherein the chamber is set in a temperature between 40° C.~400° C. in step (H).

23. A flip chip package manufacturing method, comprising:
(A) providing a wafer having a plurality of conductive bumps on an upper surface of the wafer;
(B) laminating a non-conductive film onto the upper surface of the wafer;
(C) cutting the wafer to a plurality of single chips;
(D) providing at least one carrier having a plurality of bond pads corresponding the conductive bumps of the single chip, and executing a thermo-compression flip chip bonding process to attach the non-conductive film onto the carrier, such that the conductive bumps of the single chips pierce and press onto the non-conductive film on the conductive bumps to make contact with the predetermined bond pads on the carrier;
(E) executing a high-temperature compression soldering process to solder at least one single chip onto the carrier;
(F) transferring the carrier into a chamber having enclosed, pneumatic pressurized and heatingable characteristics, and executing a de-void process to eliminate at least one first bubble in a first junction between the carrier and the non-conductive film, at least one second bubble in a second junction between the non-conductive film and the single chips, and at least one third bubble inside the non-conductive film caused by heating the non-conductive film during the thermo-compression flip chip bonding process; and
(G) executing an inspection process.

24. The flip chip package manufacturing method of claim 23, wherein the conductive bumps comprise at least one material selected from the group consisting of tin, silver, copper, gold, indium, lead, bismuth and zinc.

25. The flip chip package manufacturing method of claim 23, wherein the carrier is one of print circuit board(PCB), substrate, chip, silicon interposer and package.

26. The flip chip package manufacturing method of claim 23, wherein in the thermo-compression flip chip bonding process in step (D), is executed in a press and temperature setting such that the conductive bumps on the single chips can pierce and press onto the non-conductive film, and make contact with the predetermined bond pads of the carrier.

27. The flip chip package manufacturing method of claim 23, wherein in the chamber is set in a pneumatic pressure greater than 2 atm in step (F).

28. The flip chip package manufacturing method of claim 23, wherein the chamber is set in a temperature between 40° C.~400° C. in step (F).

* * * * *